United States Patent
Sun

(10) Patent No.: US 7,985,082 B2
(45) Date of Patent: Jul. 26, 2011

(54) EXTERNAL USB CARD READER

(75) Inventor: Zheng-Heng Sun, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 161 days.

(21) Appl. No.: 12/468,829

(22) Filed: May 19, 2009

(65) Prior Publication Data

US 2010/0267259 A1 Oct. 21, 2010

(30) Foreign Application Priority Data

Apr. 21, 2009 (CN) .......................... 2009 1 0301690

(51) Int. Cl.
*H01R 13/44* (2006.01)
(52) U.S. Cl. ......... 439/131; 439/159; 439/945; 235/441
(58) Field of Classification Search .................. 439/131, 439/159, 636, 638, 945; 235/441, 486
See application file for complete search history.

(56) References Cited

U.S. PATENT DOCUMENTS

| | | | |
|---|---|---|---|
| 6,676,419 B1* | 1/2004 | Lin et al. ...................... | 439/76.1 |
| 7,092,256 B1* | 8/2006 | Salazar et al. ................. | 361/737 |
| 7,303,411 B1* | 12/2007 | Morganstern et al. ........ | 439/131 |
| 7,335,036 B1* | 2/2008 | Lin ................................ | 439/131 |
| 2007/0101060 A1* | 5/2007 | Robinson et al. ............. | 711/115 |
| 2010/0123006 A1* | 5/2010 | Chen ............................. | 235/441 |
| 2010/0279526 A1* | 11/2010 | Chiang ......................... | 439/131 |

* cited by examiner

Primary Examiner — Xuong M Chung Trans
(74) Attorney, Agent, or Firm — Zhigang Ma

(57) ABSTRACT

An external universal serial bus (USB) card reader includes a cover, a circuit board movably received in the cover, a USB connector, and a connector. The USB connector is mounted to a front end of the circuit board. The connector is mounted to a back end of the circuit board and electrically connected to the USB connector. A through cutout is defined in the cover to allow the USB connector pass through. An inserting slot is defined in the cover to allow a memory card pass through. The USB connector is operable to be forced by the memory card to drive the circuit board to move in the cover, resulting in the USB connector extending out of the cover or retracting back into the cover through the through cutout.

9 Claims, 6 Drawing Sheets

EXTERNAL USB CARD READER

BACKGROUND

1. Technical Field

The present disclosure relates to card readers, and particularly to an external universal serial bus (USB) card reader.

2. Description of Related Art

External USB card readers are popular, because they let users conveniently exchange data, photos, games and music stored on memory expansion cards between mobile phones, computers, laptops, cameras, PDAs and other devices. At present however, the USB connector of a card reader typically extends out from a main body of the card reader, and is easily damaged. To protect the USB connector, a cover is designed to cover the USB connector of the card reader. However, the cover is easy to be lost.

DETAILED DESCRIPTION

Figure 1:
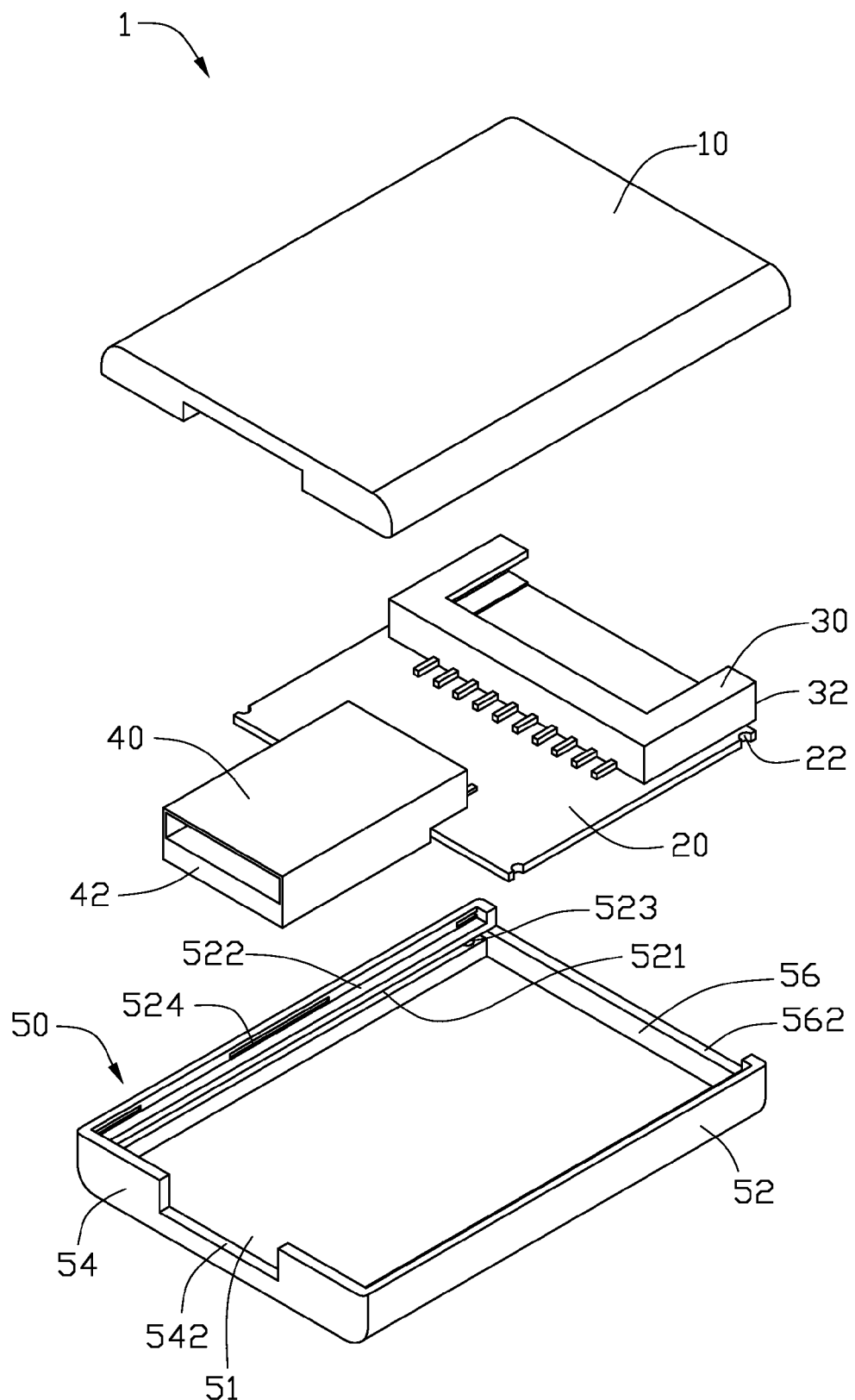
FIG. 1 is an exploded, isometric view of an exemplary embodiment of an external USB card reader.

Referring to FIG. 1, an exemplary external universal serial bus (USB) card reader 1 includes a cover, a circuit board 20, a USB connector 40 positioned on a front end of the circuit board 20, and a connector 30 positioned on a back end of the circuit board 20. The USB connector 40 is electrically connected to the connector 30 via the circuit board 20. The cover includes an upper cover 10 and a lower cover 50, which is capable of being fixed to the upper cover 10.

The lower cover 50 is rectangular and includes a bottom wall 51, two sidewalls 52 perpendicularly extending up from opposite sides of the bottom wall 51, a front wall 54 perpendicularly extending up from a front end of the bottom wall 51, and a back wall 56 perpendicularly extending up from a rear end of the bottom wall 51. Two sliding slots 521 are defined in inner surfaces of the two sidewalls 52, respectively, extending from the front wall 54 to the back wall 56 to allow opposite sides of the circuit board 20 to slide therein. Two blocks 523 functioning as fastening elements are respectively formed on a front end and a back end of each sliding slot 521. Two grooves 522 are defined in tops of the two sidewalls 52, respectively, extending from the front wall 54 to the back wall 56. A plurality of slots 524 is defined in the groove 522 of each sidewall 52. A first through cutout 542 is defined in the front wall 54. A first inserting slot 562 is defined in the back wall 56.

Two semicircular openings 22 are respectively defined in each side of the circuit board 20, respectively adjacent to a front end and a rear end of the circuit board, to engage with the corresponding blocks 523 of the lower cover 50 to fix the circuit board 20 to the lower cover 50. A distance between an outer surface of a USB interface 42 of the USB connector 40 and an outer surface of an inserting portion 32 of the connector 30 is equal to a length of the cover.

Figure 2:
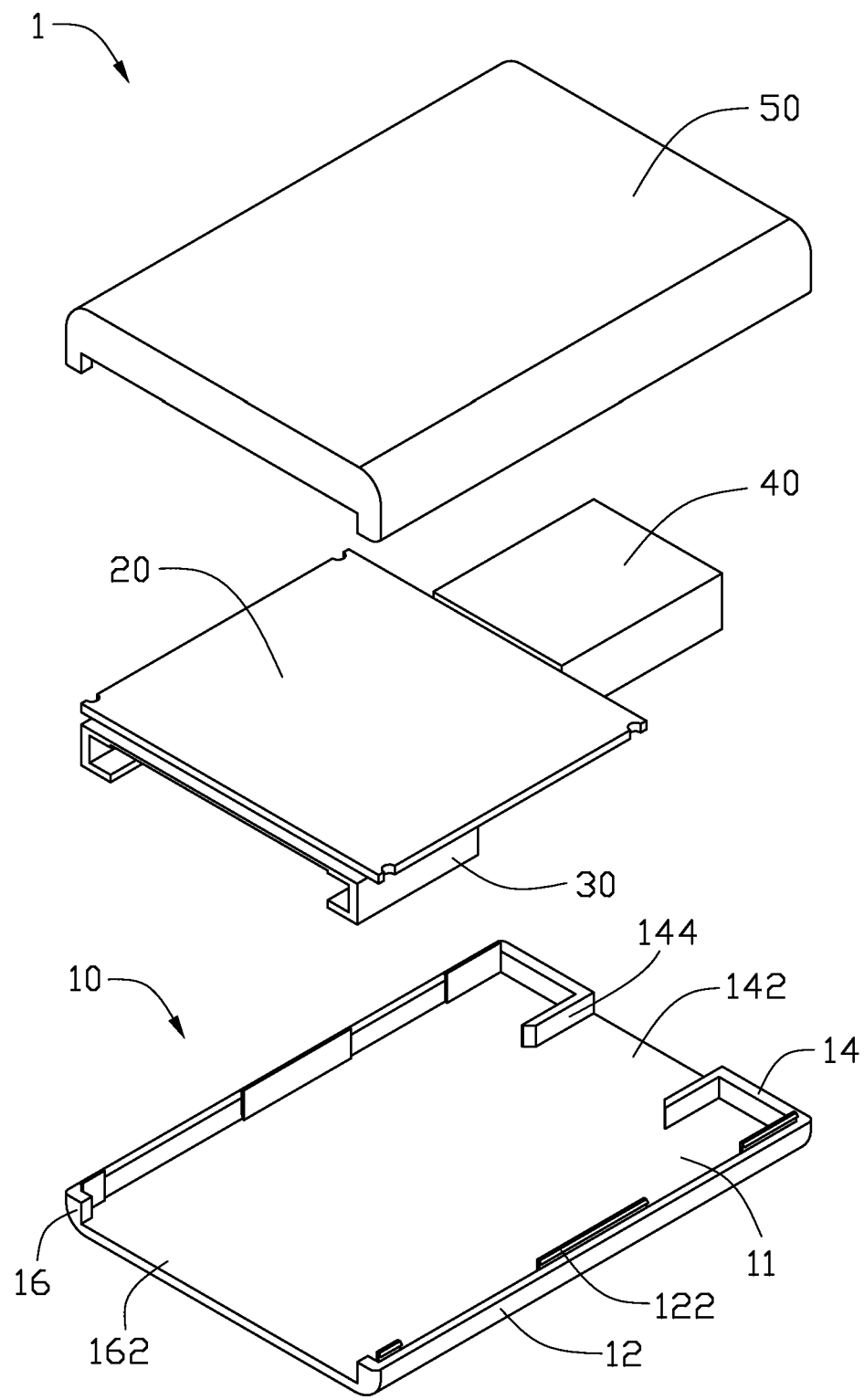
FIG. 2 is an inverted view of the external USB card reader of FIG. 1.

Referring to FIG. 2, the upper cover 10 includes a top wall 11, two sidewalls 12 perpendicularly extending down from opposite sides of the top wall 11, a front wall 14 perpendicularly extending down from a front end of the top wall 11, and a back wall 16 perpendicularly extending down from a rear end of the top wall 11. A plurality of clasps 122 are protuberantly positioned on inner sides of each sidewall 12, to engage with the corresponding latching slots 524 of the lower cover 50. A second through cutout 142 corresponding to and communicating with the first through cutout 542 is defined in the front wall 14, to allow the USB connector 40 to pass therethrough. A second inserting slot 162 corresponding to and communicating with the first inserting slot 562 is defined in the back wall 16, to allow a memory card 60 (shown in FIG. 5) to pass therethrough. Two guiding walls 144 extend backward from the front wall 14, at opposite ends of the second through cutout 142 to guide the USB connector 40 to pass through the second through cutout 142.

In another embodiment, a plurality of grooves functioning as fastening elements are defined in each sidewall 52 of the lower cover 50 to replace the blocks 523. A plurality of protrusions extend from each side of the circuit board 20 to replace the opening 22, to engage with the plurality of grooves to fix the circuit board 20 to the lower cover 50 of the external USB card reader 1. The sliding slots 521 can be defined in the two sidewalls 12 of the upper cover 10. Therefore, a plurality of blocks 523 can extend from the sliding slots of the two sidewalls 12 of the upper cover 10, to fix the circuit board 20. The circuit board 20 can be fixed to the cover via other means. The second through cutout 142 may be omitted from the upper cover 10 and the first through cutout 542 made larger, to allow the USB connector 40 of the circuit board 20 to extend out from the cover of the external USB card reader 1.

Figure 3:
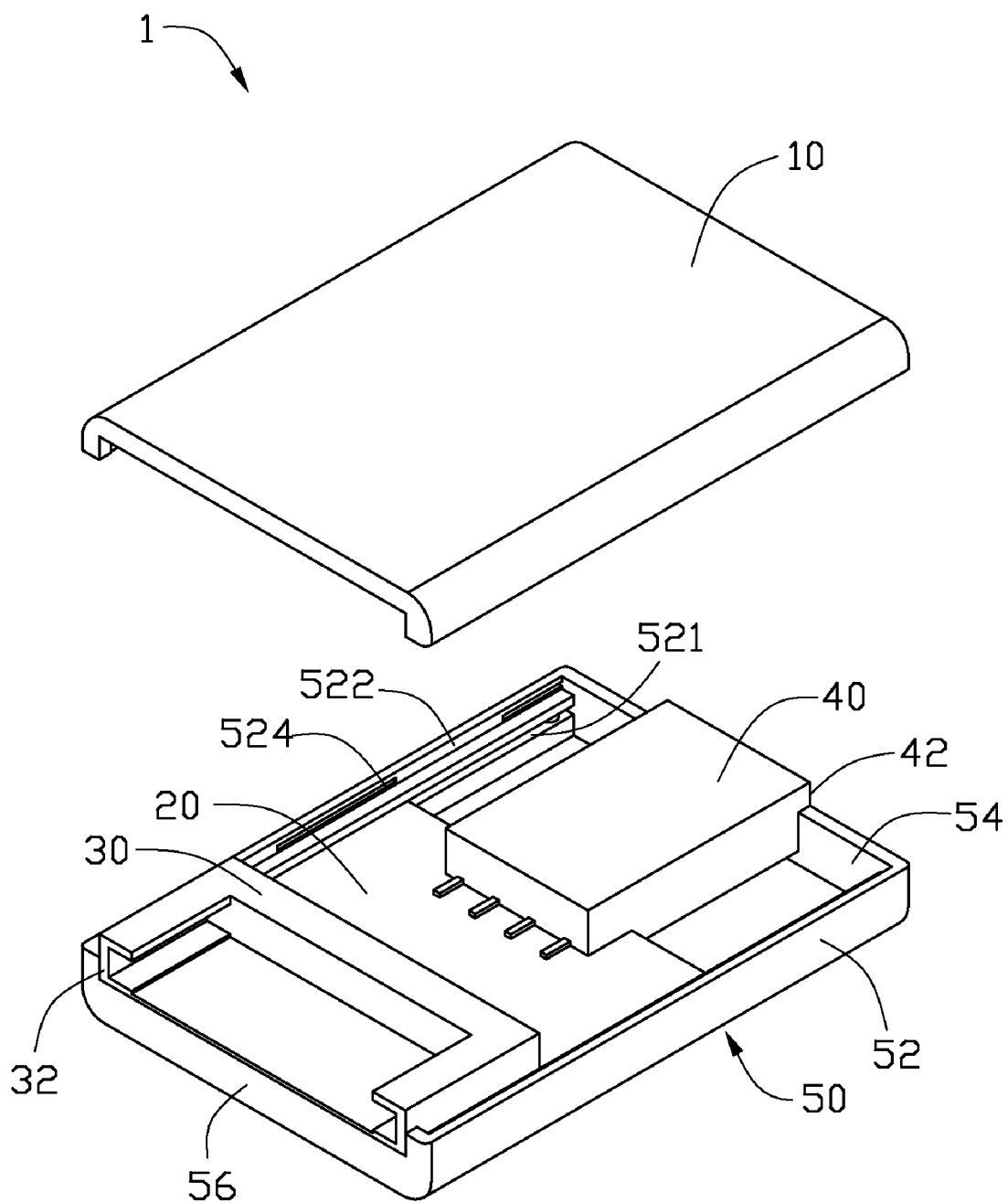
FIG. 3 is a partially assembled, isometric view of the external USB card reader of FIG. 1, but viewed from another perspective.
Figure 4:
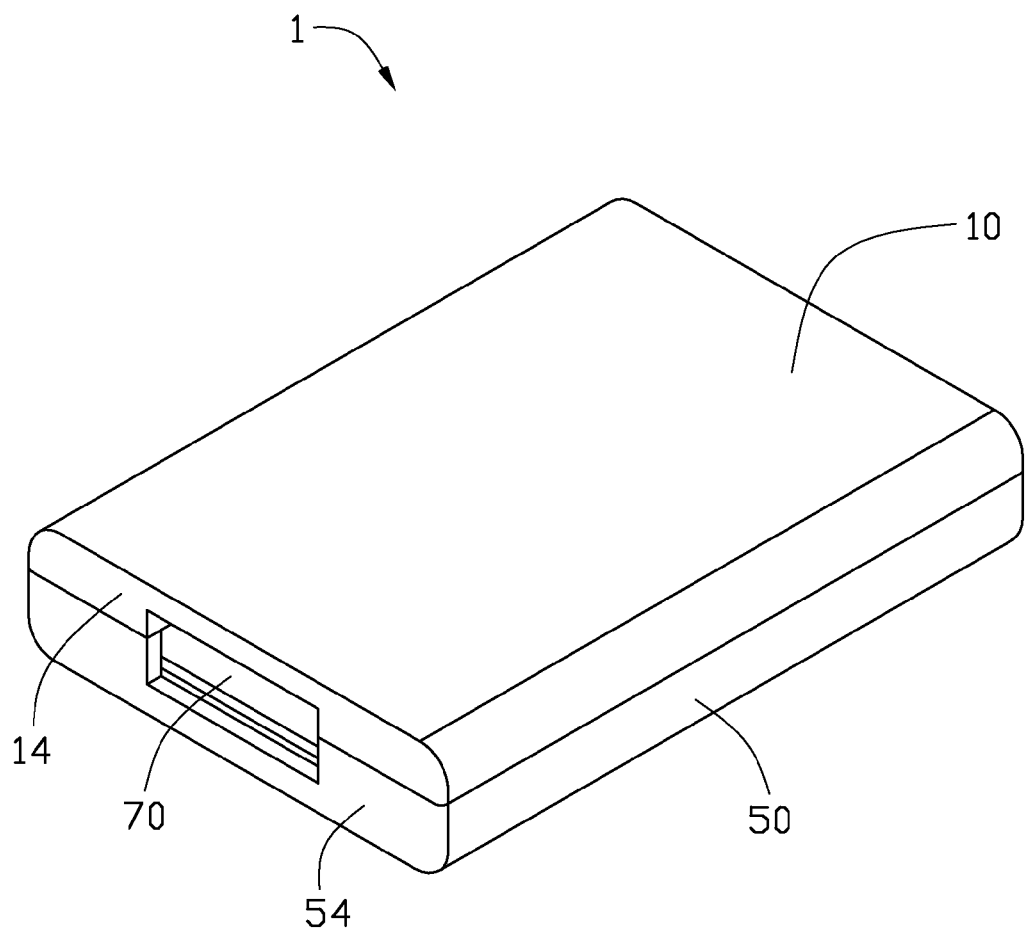
FIG. 4 is an assembled, isometric view of the external USB card reader of FIG. 1.

Referring to FIGS. 3 and 4, in assembly, opposite sides of the circuit board 20 are received in the grooves 522 of the lower cover 50, and the back end of the circuit board 20 touches an inner surface of the back wall 56 of the lower cover 50. The circuit board 20 is driven down toward the bottom wall 51 of the lower cover 50 to deform, thereby the two sides of the circuit board 20 are received in the sliding slots 521. The blocks 523 at the back end of the lower cover 50 are engaged in the corresponding openings 22 of the circuit board 20, to fix the circuit board 20 to the back end of the lower cover 50. The outer surface of the inserting portion 32 and an outside surface of the back wall 56 of the lower cover 50 are in the same plane. The outer surface of the USB interface 42 of the USB connector 40 and an outside surface of the front wall 54 of the lower cover 50 are in the same plane. The upper cover 10 is covered on the lower cover 50 to form the cover. The plurality of clasps 122 of the upper cover 10 are engaged in the corresponding latching slots 524 of the lower cover 50, to fix the upper cover 10 to the lower cover 50. Therefore, the circuit board 20, the connector 30, and the USB connector 40 are received in the cover. The first through cutout 542 and the second through cutout 142 combines to form a through hole 70 to expose the USB connector 40. The first inserting slot 562 and the second inserting slot 162 combines to form an inserting slot to allow the memory card 60 to pass therethrough.

Figure 5:
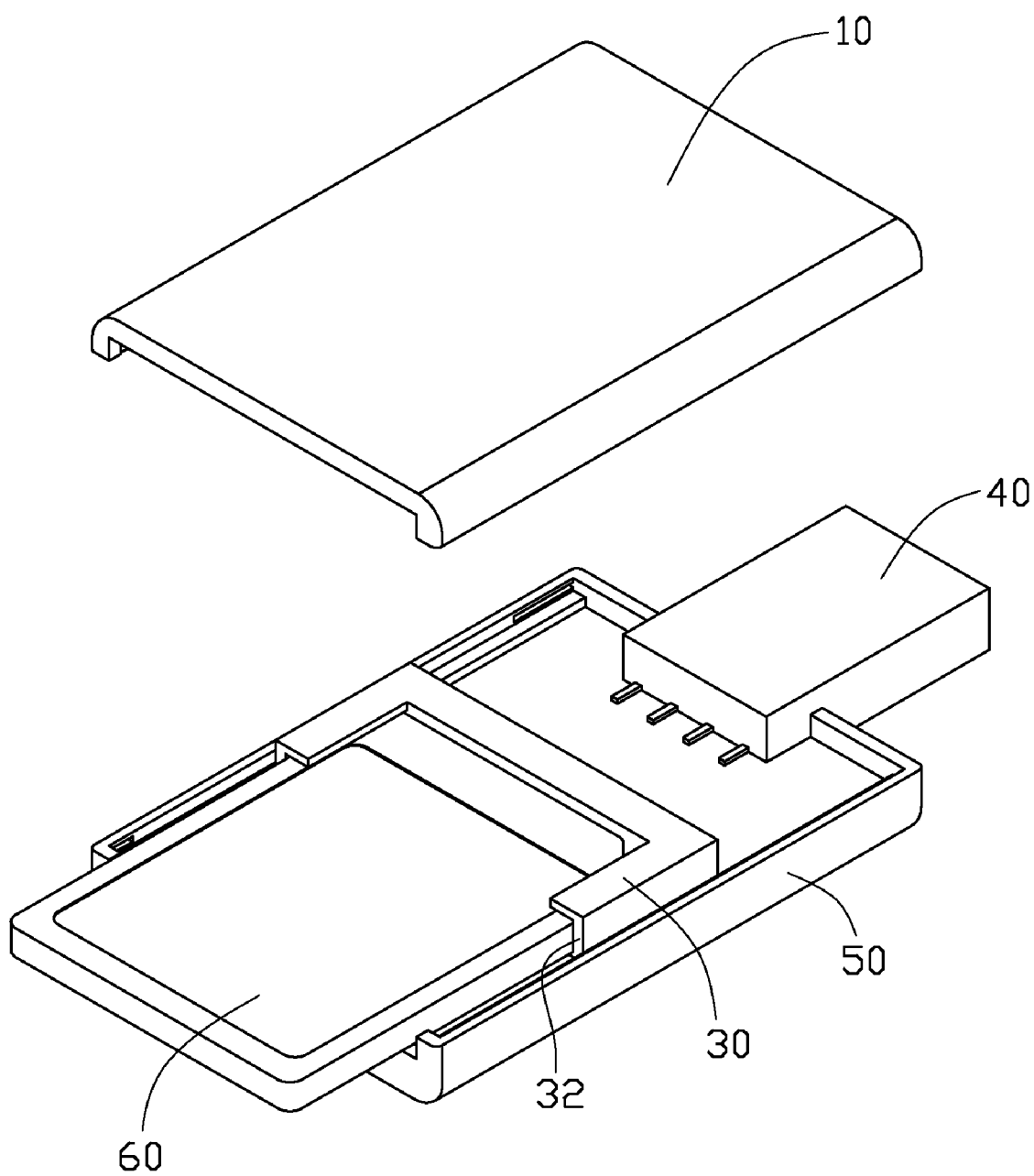
FIG. 5 is similar to FIG. 3, but showing a memory card connected to the USB card reader.
Figure 6:
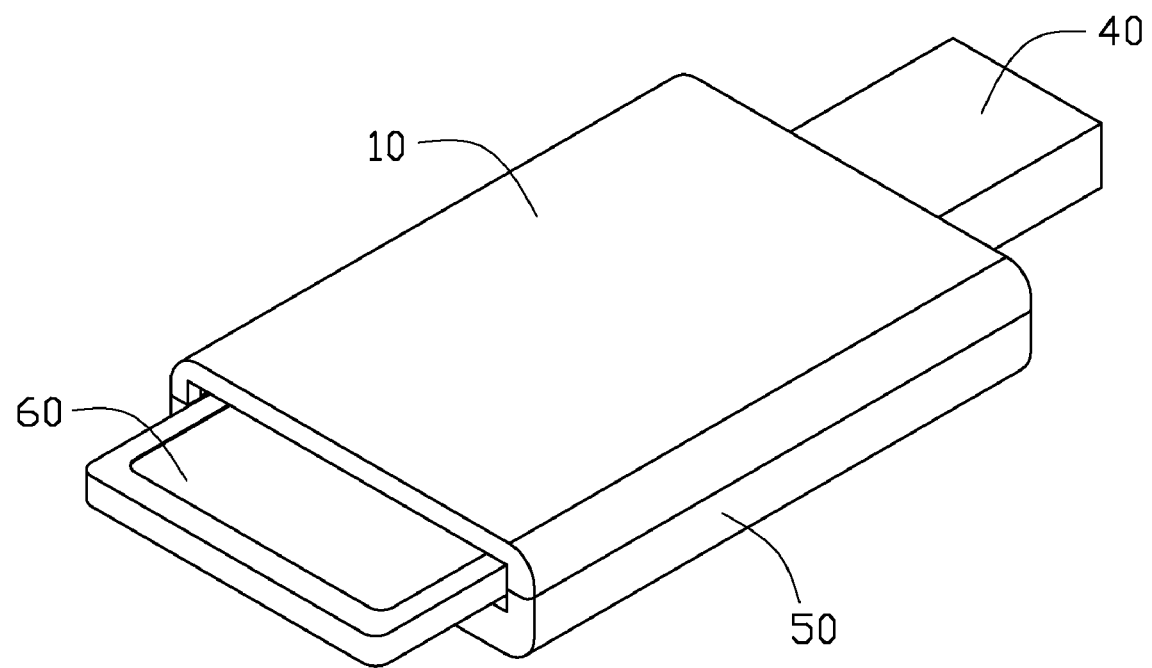
FIG. 6 is an assembled, isometric view of the external USB card reader and the memory card of FIG. 5.

Referring to FIGS. 5 and 6, in use, the memory card 60 passes through the inserting slot to engage with the connector 30. The memory card 60 is forced to drive the circuit board 20 to move, to disengage the blocks 523 at the back end of the lower cover 50 from the corresponding opening 22 of the circuit board 20. The USB connector 40 moves forward along the guiding walls 144 to the front end of the lower cover 50, together with the circuit board 20. At this position, the blocks 523 at the front end of the lower cover 50 are engaged in the openings 22 at the front end of the circuit board 20. The circuit board 20 is fixed to the front end of the lower cover 50. The USB connector 40 extends out of the cover through the through hole 70, to connect to a USB connector of an electronic device that receives the card reader 1, thereby to realize communication between the memory card 60 and the electronic device.

When the memory card 60 needs to be removed from the electronic device, the memory card 60 is pulled backward to drive the circuit board 20 to move backward. The blocks 523 at the front end of the lower cover 50 are disengaged from the openings 22 at the front end of the circuit board 20. The USB connector 40 moves backward along the guiding walls 144 to the back end of the lower cover 50, following the movement of the circuit board 20. At this moment, the block 523 at the back end of the lower cover 50 are engaged with the openings 22 at the back end of the circuit board 20. The circuit board 20 is fixed to the back end of the lower cover 50 again. The USB interface 40 retracts back into the cover.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An external universal serial bus (USB) card reader, comprising:
   a cover;
   a circuit board movably received in the cover;
   a USB connector mounted to a front end of the circuit board; and
   a connector mounted to a back end of the circuit board and electrically connected to the USB connector via the circuit board,
   wherein a through cutout is defined in the cover to allow the USB connector to pass through, an inserting slot is defined in the cover to allow a memory card to pass through to connect to the connector, wherein the USB connector is operable to be forced by the memory card to drive the circuit board to move in the cover, resulting in the USB connector extending out from the cover or retracting back into the cover through the through cutout, the cover comprises a first cover and a second cover mounted to the first cover to enclose the circuit board, the USB connector, and the connector, wherein the first cover comprises a bottom wall, a front wall, a back wall, and two sidewalls, two sliding slots are defined in inner surfaces of the two sidewalls of the first cover, respectively, extending from the front wall to the back wall, to allow the circuit board to slide in the cover.

2. The external USB card reader of claim 1, wherein a plurality of fastening elements are formed on each sidewall of the first cover to fix the circuit board.

3. The external USB card reader of claim 2, wherein the plurality of fastening elements comprises two blocks formed in a corresponding sliding slot, respectively adjacent to the front wall and back wall of the first cover, to engage in a corresponding side of the circuit board.

4. The external USB card reader of claim 3, wherein the second cover comprises a front wall, a back wall, and two sidewalls, two grooves are defined in tops of the two sidewalls of the first cover, respectively, from the front wall to the back wall of the first cover, a plurality of latching slots are defined in the groove of each sidewall of the first cover, a plurality of clasps are protuberantly positioned on an inner side of each sidewall of the second cover, to engage with the plurality of latching slots of the first cover.

5. The external USB card reader of claim 3, wherein two openings are respectively defined in each side of the circuit board, respectively adjacent to a front end and a rear end of the circuit board, to engage with the corresponding blocks of the first cover to fix the circuit board at the two sidewalls, adjacent to the front wall or back wall of the first cover.

6. The external USB card reader of claim 1, wherein the through cutout is defined in the front wall of the first cover, the inserting slot is defined in the back wall of the first cover.

7. The external USB card reader of claim 1, wherein the second cover comprises a front wall, a back wall, and two sidewalls, the front wall of the first cover defines a first through cutout, the back wall of the first cover defines a first inserting slot, the front wall of the second cover defines a second through cutout, the back wall of the second cover defines a second inserting slot, the first and second through cutouts combine to form the through hole, the first and second inserting slots combine to form the inserting slot.

8. The external USB card reader of claim 7, wherein two guiding walls extend backward from the front wall of the second cover, at opposite ends of the second through cutout, to guide the USB connector to pass through the through hole.

9. The external USB card reader of claim 1, wherein a distance between an outer surface of an USB interface of the USB connector and an outer surface of the connector is equal to a length of the cover.

* * * * *